USO10270584B2

United States Patent
Rogers et al.

(10) Patent No.: US 10,270,584 B2
(45) Date of Patent: *Apr. 23, 2019

(54) METHOD AND CIRCUITS FOR PHASE-LOCKED LOOPS

(71) Applicant: Analog Bits Inc., Sunnyvale, CA (US)

(72) Inventors: Alan C. Rogers, Palo Alto, CA (US); Kowshik Murali, San Francisco, CA (US); Raghunand Bhagwan, Sunnyvale, CA (US)

(73) Assignee: Analog Bits Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/896,319

(22) Filed: Feb. 14, 2018

(65) Prior Publication Data

US 2018/0241541 A1  Aug. 23, 2018

Related U.S. Application Data

(63) Continuation of application No. 15/094,374, filed on Apr. 8, 2016, now Pat. No. 9,900,144.

(51) Int. Cl.
*H04L 7/00* (2006.01)
*H04L 7/033* (2006.01)
(Continued)

(52) U.S. Cl.
CPC .............. *H04L 7/033* (2013.01); *H03L 7/089* (2013.01); *H03L 7/091* (2013.01); *H03L 7/093* (2013.01);
(Continued)

(58) Field of Classification Search
CPC ...................................................... H04L 7/033
(Continued)

(56) References Cited

U.S. PATENT DOCUMENTS

| 4,827,225 A | 5/1989 | Lee |
| 5,341,405 A | 8/1994 | Mallard, Jr. |

(Continued)

FOREIGN PATENT DOCUMENTS

WO   WO 2006/093599   9/2006

OTHER PUBLICATIONS

International Search Report and Written Opinion in International Application No. PCT/US2017/026446, dated Jul. 13, 2017, 8 pages.

(Continued)

*Primary Examiner* — Lihong Yu
(74) *Attorney, Agent, or Firm* — Fish & Richardson P.C.

(57) ABSTRACT

A phase lock loop (PLL) includes: a binary phase detector configured to generate a first and second polarity signals that respectively indicating whether an incoming data stream is leading a feedback signal, or whether the feedback signal is leading the incoming data stream, wherein a difference between the first and second polarity signals does not represent an amount of phase difference between the incoming data stream and the feedback signal; a digital filter configured to: generate filtered first polarity signal on a first path and a second path that are different; and generate filtered second polarity signal on a third path and a fourth path that are different; a charge pump coupled to the digital filter and configured to: integrate the filtered first polarity signal and the filtered second polarity signal; and an oscillator configured to generate the synthesized clock signal serving as the feedback signal.

20 Claims, 7 Drawing Sheets

(51) Int. Cl.
  *H03L 7/091*    (2006.01)
  *H03L 7/093*    (2006.01)
  *H03L 7/089*    (2006.01)
  *H03L 7/099*    (2006.01)

(52) U.S. Cl.
  CPC .......... *H03L 7/0995* (2013.01); *H04L 7/0008* (2013.01); *H03L 7/0891* (2013.01)

(58) Field of Classification Search
  USPC ........................................................ 375/358
  See application file for complete search history.

(56) References Cited

U.S. PATENT DOCUMENTS

| | | |
|---|---|---|
| 9,900,144 B2 * | 2/2018 | Rogers .................... H04L 7/033 |
| 2003/0197537 A1 | 10/2003 | Saint-Laurent |
| 2004/0130364 A1 | 7/2004 | Suzuki |
| 2006/0125537 A1 | 6/2006 | Yeh |
| 2007/0205825 A1 | 9/2007 | Dosho |
| 2008/0063128 A1 | 3/2008 | Chatwin |
| 2009/0015338 A1 | 1/2009 | Frey |
| 2011/0156777 A1 | 6/2011 | Wei et al. |
| 2011/0254633 A1 | 10/2011 | Lin et al. |
| 2014/0035632 A1 | 2/2014 | Lamanna et al. |
| 2014/0292388 A1 | 10/2014 | Mohajeri et al. |
| 2017/0295009 A1 | 10/2017 | Rogers et al. |

OTHER PUBLICATIONS

Extended European Search Report in Application No. 17779867.5, dated Feb. 25, 2019, 8 pages.

* cited by examiner

Binary Phase Detector Truth-Table

| Inputs | | | Intermediate Nodes | | | Outputs | | Decision |
|---|---|---|---|---|---|---|---|---|
| A | B | C | D | E | F | SLOWER | FASTER | |
| 0 | 0 | 0 | 0 | 0 | 0 | 0 | 0 | No transition |
| 0 | 0 | 1 | 1 | 1 | 0 | 1 | 0 | Clock is ahead |
| 0 | 1 | 0 | 1 | 0 | 1 | 0 | 0 | Error sample |
| 0 | 1 | 1 | 0 | 1 | 1 | 0 | 1 | Clock is behind |
| 1 | 0 | 0 | 0 | 1 | 1 | 0 | 1 | Clock is behind |
| 1 | 0 | 1 | 1 | 0 | 1 | 0 | 0 | Error sample |
| 1 | 1 | 0 | 1 | 1 | 0 | 1 | 0 | Clock is ahead |
| 1 | 1 | 1 | 0 | 0 | 0 | 0 | 0 | No transition |

METHOD AND CIRCUITS FOR PHASE-LOCKED LOOPS

CROSS-REFERENCE TO RELATED APPLICATIONS

This application claims priority to U.S. application Ser. No. 15/094,374, filed on Apr. 8, 2016. The disclosure of the prior application is considered part of the disclosure of this application, and is incorporated in its entirety into this application.

TECHNICAL FIELD

The disclosure generally relates to phase-lock loops (PLL) and in particular to phase-lock loops used to generate a clock signal from a data stream.

BACKGROUND

Phase-locked loops (PLLs) are widely used in, for example, communications for coherent carrier tracking and threshold extension, bit synchronization, as well as symbol synchronization. Phase-locked loop (PLL) is an electronic circuit that controls an oscillator so that it maintains a constant phase relationship relative to an input reference signal. Generally, maintaining a constant phase relationship is otherwise referred to by stating that "the oscillator is in lock with" or "is locked to" the input reference signal.

SUMMARY

In one aspect, some implementations provide a phase lock loop (PLL) circuit for synthesizing a clock signal from an incoming data stream, the PLL circuit includes: a binary phase detector configured to receive the incoming data stream comprising binary bits, and a feedback signal, and generate a first polarity signal and a second polarity signal, the first and second polarity signals respectively indicating whether the incoming data stream is leading the feedback signal, or whether the feedback signal is leading the incoming data stream, wherein a difference between the first polarity signal and the second polarity signal does not represent an amount of phase difference between the incoming data stream and the feedback signal; a digital filter coupled to the binary phase detector and configured to receive the first polarity signal and the second polarity signal, and filter the first polarity signal such that the filtered first polarity signal is generated on a first path and a second path, the first and second paths being different; and filter the second polarity signal such that the filtered second polarity signal is generated on a third path and a fourth path, the third and fourth paths being different; a charge pump coupled to the digital filter and configured to: receive the filtered first polarity signal on the first path, receive the filtered second polarity signal on the second path; and integrate the filtered first polarity signal and the filtered second polarity signal such that an integral signal is generated; and an oscillator coupled to the charge pump and the digital filter, the oscillator configured to receive the integral signal from the charge pump, receive, from the digital filter, the filtered first polarity signal on the third path; receive, from the digital filter, the filtered second polarity signal on the fourth path, and generate the synthesized clock signal, wherein the oscillator is configured such that the frequency of the synthesized clock signal is controlled by the integral signal as well as the first and second polarity signals received, and wherein the synthesized clock signal is looped back to the binary phase detector as the feedback signal.

Implementations may include one or more of the following features.

The binary phase detector may include multiple flip-flops. The flip-flops may be clocked by the feedback signal. The flip-flops may be edge-triggered by a rising edge or a falling edge of the feedback signal.

The PLL circuit may include a feed forward circuit connecting the charge pump to the oscillator, wherein the feed forward circuit includes a capacitor connected between a line carrying the integral signal and ground. The feed forward circuit may not include a loop stabilizing resistor. The charge pump may be configured to vary an amount of charge stored at the capacitor based on a magnitude of the integral signal and in response to the first or the second polarity signals being detected from the binary phase detector such that the amount of charge stored is incremented or decremented in accordance with the first or second polarity signals being detected.

The filtered first polarity signal on the first path and the filtered first polarity signal on the third path may be substantially identical. The filtered second polarity signal on the second path and the filtered second polarity signal on the fourth path may be substantially identical. The filtered first polarity signal on the first path and the filtered first polarity signal on the third path may be different. The filtered second polarity signal on the second path and the filtered second polarity signal on the fourth path may be different.

In another aspect, some implementations provide a method for synthesizing a clock from an incoming data stream, the method including: receiving the incoming data stream comprising binary bits, and a feedback signal; generating a first polarity signal and a second polarity signal, the first and second polarity signals respectively indicating whether the incoming data stream is leading the feedback signal, or whether the feedback signal is leading the incoming data stream, wherein a difference between the first polarity signal and the second polarity signal does not represent an amount of phase difference between the incoming data stream and the feedback signal; digitally filtering the first polarity signal and the second polarity signal; generating an integral signal by integrating the filtered first polarity signal and the filtered second polarity signal; generating the synthesized clock signal based on the integral signal, the filtered first polarity signal, and the filtered second polarity signal, wherein the synthesized clock signal has a frequency that is controlled by the integral signal as well as the filtered first and second polarity signals, and wherein the synthesized clock signal serves as the feedback signal.

Implementations may include one or more of the following features.

The method may include: generating a first polarity signal and a second polarity signal includes using a plurality of flip-flops and logic gates to generate the first and second polarity signals. The method may also include: clocking the flip flops by the feedback signal. The method may include: triggering the flip-flops on clock edges at a rising edge or a falling edge of the feedback signal. Integrating the filtered first and second polarity signals may be performed by a charge pump coupled to a capacitor such that an amount of charge stored at the capacitor is varied based on a magnitude of the generated integral signal and in response to the first or the second polarity signals being detected from the binary phase detector, and wherein the amount of charge stored is incremented or decremented in accordance with the first or second polarity signals being detected.

Filtering the first polarity signal and the second polarity signal may include: digitally filtering the first polarity signal such that the filtered first polarity signal is generated on a first path and a second path, the first and second paths being different; and digitally filtering the second polarity signal such that the filtered second polarity signal is generated on a third path and a fourth path, the third and fourth paths being different. Integrating the filtered first polarity signal and the filtered second polarity signal to generate the integral signal may include: integrating the first polarity signal from the first path and integrating the second polarity signal from the second path; and wherein generating the synthesized clock signal is based on the integral signal, the filtered first polarity signal from the third path, and the second polarity signal from the fourth path. The method may also include: sampling the incoming data stream based on the synthesized clock signal; and deserializing the converted data stream suitable for subsequent processing by a digital processor.

The details of one or more embodiments are set forth in the accompanying drawings and the description below. Other aspects, features, and advantages will become apparent from the description, the drawings, and the claims.

DESCRIPTION OF DRAWINGS

Like reference symbols in the various drawings indicate like elements.

DETAILED DESCRIPTION

In order for the PLL to lock to the incoming data stream, two feed forward control paths are used, namely, a proportional control path and an integral control path. The proportional control path generally refers to the path for a signal with a magnitude that is proportional to the amount of phase difference between the oscillator output and the input data stream. The integral control path refers to the path for a signal corresponding to an integration of the phase difference. These paths can be implemented using analog techniques. Digital techniques, however, are being increasingly employed, in which the proportional control path may not be available. This is because a binary phase detector is used in the digital techniques. The binary phase detector may generate a signal solely indicating a polarity of the phase comparison—for example, whether the phase of the oscillator output is leading or lagging the phase of the input data stream. This resulting signal is known as a polarity signal, which, on its own, may not be suitable for a proportional control path as used in analog techniques. To effectively lock an incoming data stream, in some implementations, two polarity signals—respectively representing whether the phase of the input reference signal is ahead of the oscillator output and whether the phase of the oscillator output is ahead of the input reference—are directly injected into the oscillator through a polarity control path and without using a proportional control path. In other words, some implementations achieve phase locking for a digital input data stream using a polarity control path in which polarity control signals are generated from a binary phase detector, and the polarity control signals are directly fed into the oscillator.

For context, a technique for generating a clock signal to sample an input data stream is to use a dedicated reference signal of identical or substantially identical frequency to the data stream, and to adjust a phase offset of the reference signal with regard to the input data stream. Yet, a dedicated reference signal may not always be available as a separate source distinct from the input data stream. Moreover, these techniques may not be applicable at very high bit rates.

By synthesizing a clock signal from the input binary data stream and using the synthesized clock signal as the reference signal, a clock signal can be extracted solely from the input binary data stream. This approach of synthesizing a clock signal can obviate the need for a dedicated local reference signal, something that could give rise to its own issues. The sui generis nature of this approach is agile enough for handling incoming data stream at very high bit rates.

More particularly, the synthesized clock can serve as the master clock for a sampler (for example, a one-bit quantizer operable even at extremely high sampling rate) as well as a downstream deserializer (e.g., an interface to convert serial bits to parallel data). The synthesized clock can be looped back to a binary phase comparator along with the input binary data stream.

In more detail, a first binary polarity signal and a second binary polarity signal can be generated that respectively indicate whether the input binary data stream is ahead in phase (leads) the synthesized digital clock or whether the synthesized digital clock leads the input binary data stream. Neither the amplitude nor the duration of the two binary polarity signals reflect an amount of the phase difference between the input binary data stream and the synthesized digital clock, the polarity signals are not proportional to the phase difference. The difference between the two binary polarity signals do not represent the amount of the phase difference between the input binary data stream and the synthesized digital clock either. The polarity signals only indicate the polarity of the phase difference between the incoming binary data stream and the synthesized digital clock.

The first and second binary polarity signals can be digitally filtered and then fed to a charge pump that is coupled to a capacitor. The charge pump can vary an amount of charge stored by the capacitor in a manner that depends on both the first and the second binary polarity signals. An integrated voltage signal is generated to reflect the charge stored at the charge pump. An oscillator device receives the integrated signal, and this can constitute the integral control path.

The oscillator device also receives the filtered first and second binary polarity signals as well, without any integration. This path will constitute the polarity control path. The oscillator under the influence of the integral control path and the polarity control path can then synthesize the clock signal. The clock signal can serve as the feedback signal looping back to the binary phase comparator. The complete feedback loop can then act in concert such that the synthesized clock signal is in constant phase relationship with regard to the incoming binary data stream or otherwise termed as locked to the incoming binary data stream.

Using polarity signals to adjust the phase of an oscillator to correctly sample an input data stream may have a range of frequency tracking range narrower than otherwise. This may point to having the oscillator operate close to the frequency of the incoming data stream as a starting point of the feedback process. To this end, several well-known methods may be used to set the oscillator close to the frequency of the incoming data stream so that the adjustment can converge in a flawless manner.

Figure 1:
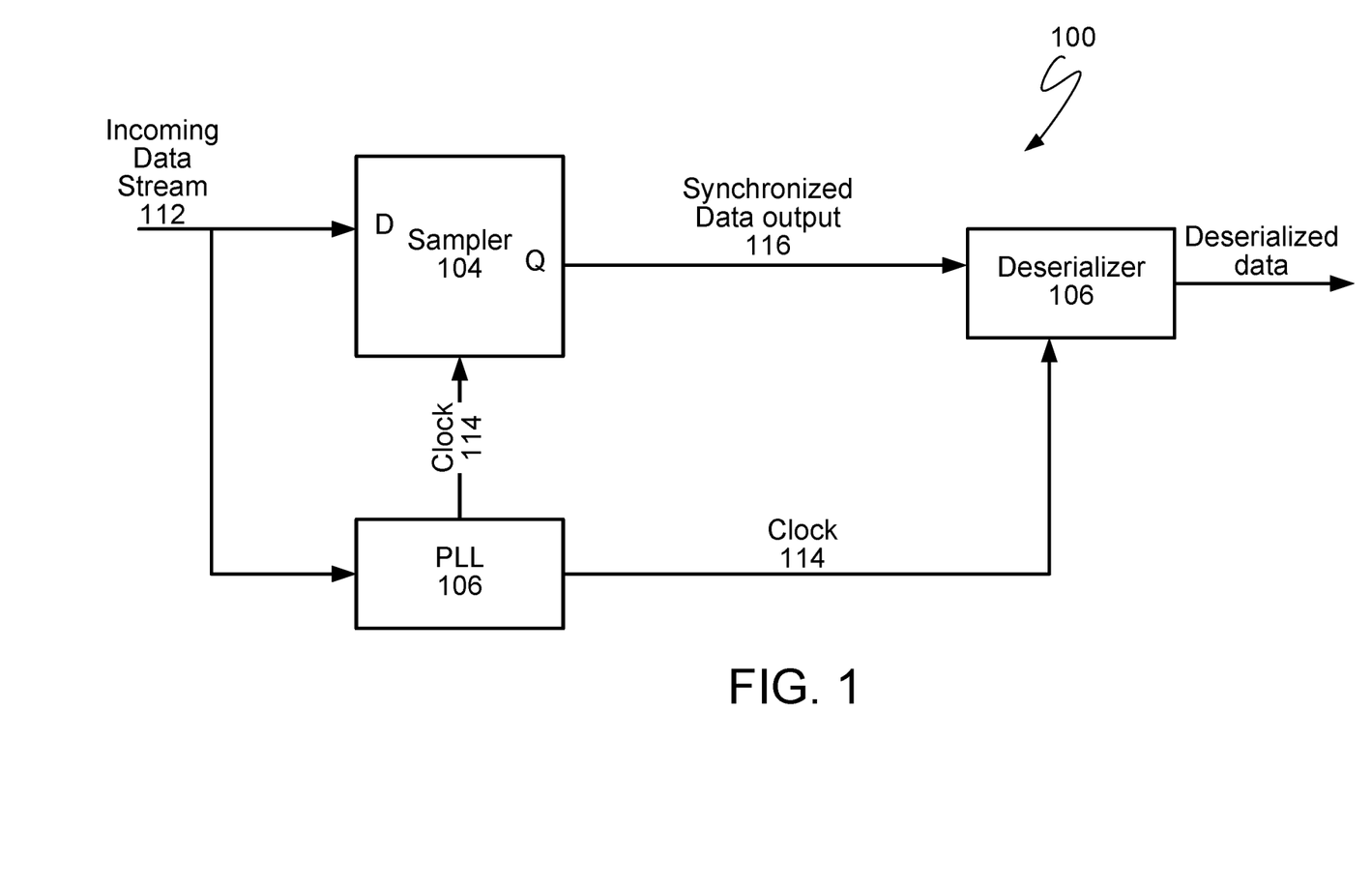
FIG. 1 is block diagram showing an example of a PLL circuit configured to synthesize a digital clock from an incoming data stream such that the incoming data stream can be deserialized.

FIG. 1 is an example of a decoder circuit 100 that includes a PLL circuit 106 configured to synthesize a digital clock 114 from an incoming data stream 112 such that the incoming data stream can be deserialized. In this illustration, the incoming data stream 112 represents a bit stream of digital data (for example, serial NRZ binary data). In one example, the bit stream can correspond to digital data as being transported on a pair of data pins on USB cables. In this example, the digital data being transported can be serialized through the use of a serial interface engine.

A sampler 104 receives the incoming data stream 112 as an analog input and a synthesized clock output 114 and perform sampling to convert the received bit stream into a digital stream. The clock 114 is synthesized locally and through a feedback loop. The sampler 104 can include a 1-bit A/D (Analog to Digital) converter. The sampler 104 can also include a D flip-flop, as shown in FIG. 1

As illustrated, the sampled digital signal provides a synchronized data output 116 that is input to a deserializer 106 run by the clock 114. The deserialier 106 can convert the bit stream of the synchronized data output 116 to multi-bit digital data for subsequent processing, for example, by digital processors or microcontrollers. The deserializer 106 could generate 4 or 5 or 8 or 10 or 16 or other bit digital data based on bit stream.

For the sampler 104 to generate the synchronized data output, the sampler 104 receives a clock signal that sets the time instances at which the incoming data stream 112 is sampled. For example, a sample can be taken from the input data stream by the sampler 104 at a time that is, for example, in the middle of the transition signals of the data stream. Likewise, the deserializer 106 also receives the clock signal and uses the same clock signal to convert serial bits to multiple bits through a parallel interface. For example, the conversion can take place every $8^{th}$ cycle so that a byte is generated from 8 bits of serial bits. In this example, the same clock signal can be divided by a factor of 8 within the deserializer 106 to realize the conversion. In short, the master clock signal 114 is synthesized from the incoming data stream 112 by the PLL 106. The synthesized clock 114 is used to run the sampler 104 and the deserializer 106.

Figure 2:
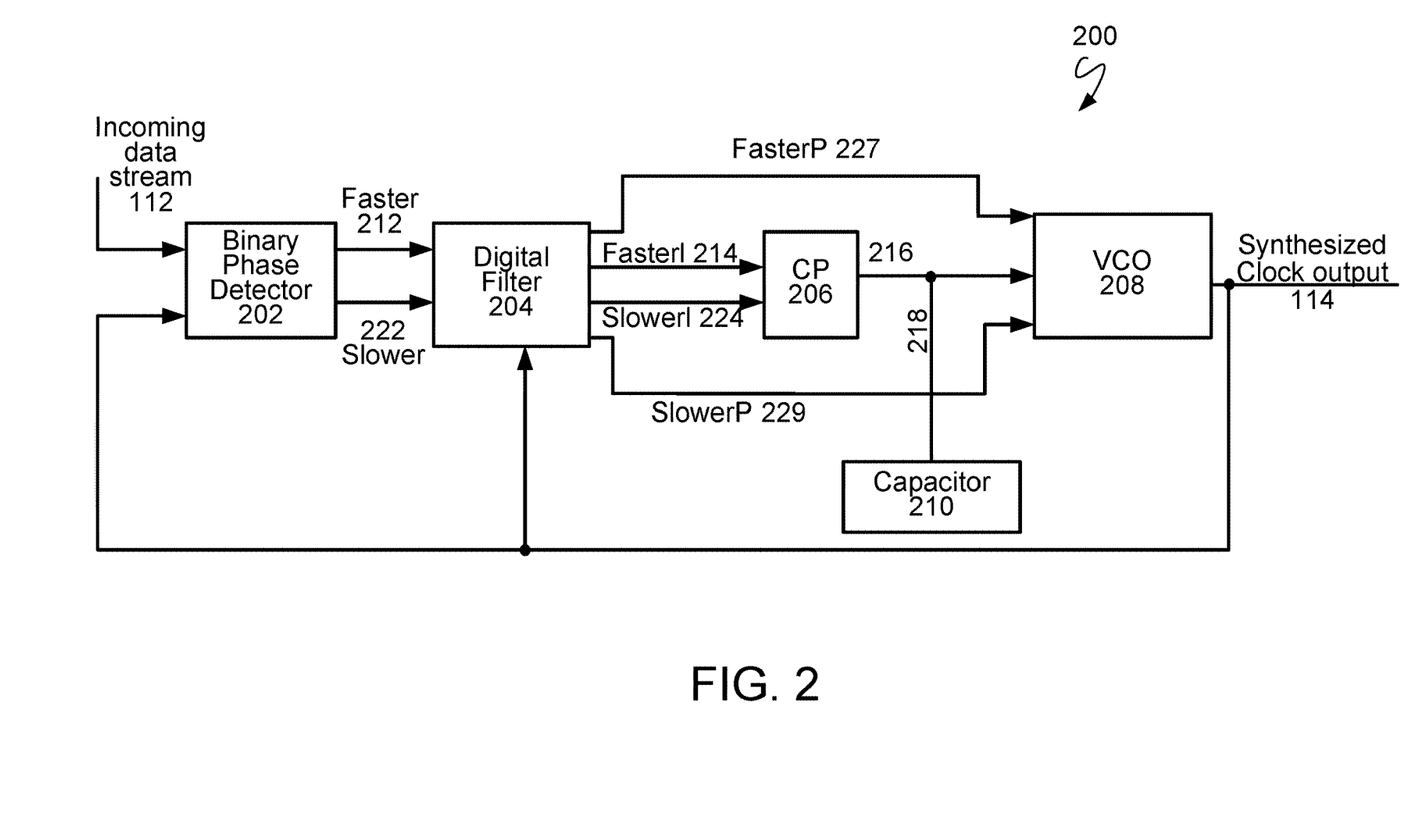
FIG. 2 is a block diagram showing the example of the PLL circuit in more detail.

FIG. 2 is a diagram 200 showing the example of the PLL circuit 106 in more detail. As illustrated, the PLL circuit 106 includes a binary phase detector 202, a digital filter 204, a charge pump 206, a voltage-controlled oscillator (VCO) 208, and a capacitor 210.

The binary phase detector 202 receives the incoming data stream 112 as the bit stream at a first input. The binary phase detector 202 also receives a digital feedback signal at a second input. In this illustration, an instance of the synthesized clock output 114 is used as a digital feedback signal while the incoming data stream 112 is used as a reference signal. The binary phase detector 202 is a digital circuit which generates binary signals indicative of the polarity of the phase difference between the feedback signal received and the reference signal received. As discussed in this disclosure, the comparison signal is known as the polarity signal. If the feedback signal has a phase later than that of the incoming data signal, the binary phase detector 202 outputs a first polarity signal along the output line 212. Conversely, when the feedback signal has a phase earlier than that of the incoming data stream 112, the binary phase detector 202 outputs a second polarity signal along the output line 222. As explained in this disclosure, the feedback signal is the synthesized clock signal from the VCO 208.

The first polarity signal is a binary signal and indicates whether feedback signal lags behind the incoming data signal. The first polarity signal need not reflect the amount of the lag. In other words, the amplitude of the first polarity signal is not reflective of the amount of phase difference between the incoming data signal and the synthesized clock output. Nor does the pulse duration of the first polarity signal encode the amount of phase difference between the incoming data signal and the synthesized clock output. For example, the pulse duration of the first polarity signal can be fixed and hence not proportional to the amount of phase difference between the incoming data signal and the synthesized clock output. The second polarity signal is likewise a binary signal and indicates whether the feedback signal is ahead of the incoming data signal (i.e., polarity only). More specifically, the second polarity signal need not reflect the amount of the lead. In more detail, neither the amplitude nor the duration of second polarity signal reflects the amount of phase difference that the incoming data signal lags behind the synthesized clock output. Hence, the first polarity signal merely indicates that the feedback signal lags behind the incoming digital signal while the second polarity signal merely indicates that the feedback signal leads the incoming digital signal.

Figure 3A:
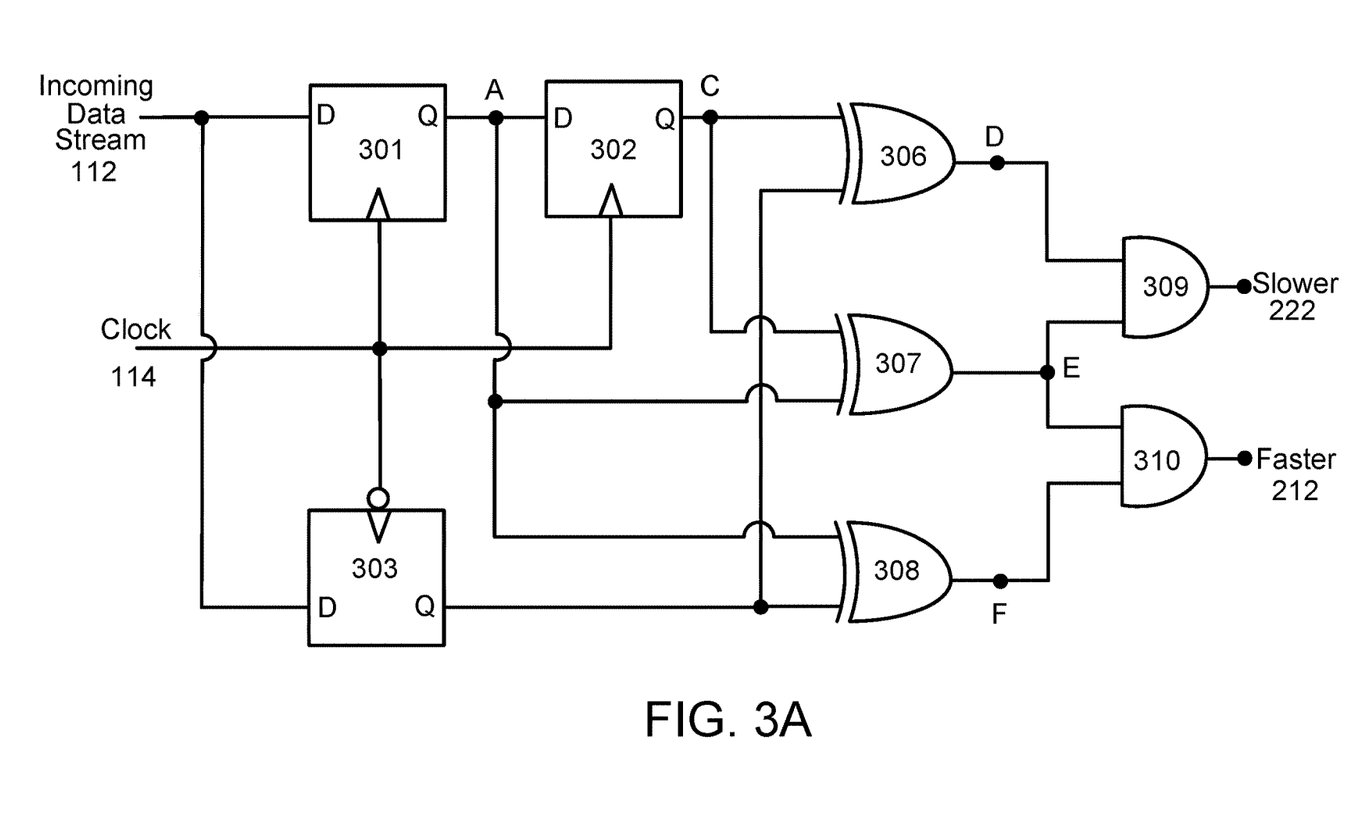
FIG. 3A is a circuit diagram showing an example of the binary phase detector from FIG. 2.

Referring to FIG. 3A, an example of a binary phase detector 202 is illustrated. This example of the binary phase detector 202 includes D flip-flops 301 to 303, XOR gates 306 307 and 308 and AND gates 309 and 310. For example, D Flip-flops 301 and 302 sample the data stream 112 on the rising edges of clock 114 to produce current data sample A and data sample C. Sequentially, data sample A precedes data sample C by one clock cycle. Flip-flop 303 samples data stream 112 on the falling edge of clock 114 to produce transition sample B.

In this illustration, A and C are fed into the XOR gate 306, producing a result at output E. Meanwhile, C and B provide the inputs to the XOR gate 307 which, in turn, produces a result at output D. Additionally A and B provide the inputs to XOR gate 308 which in turn produces a result at output F. The E and F signals are input the AND gate 310 to produce the first polarity signal, meanwhile D and E signals are input to AND gate 309 to produce the second polarity signal. The XOR 306 to 308 perform an exclusive OR and AND gates 309 to 310 perform AND operation and need not be clocked as sequential components. The values of data samples A to F can drive the output of this example of binary phase detector 202, as described in FIG. 3B.

Figure 3B:
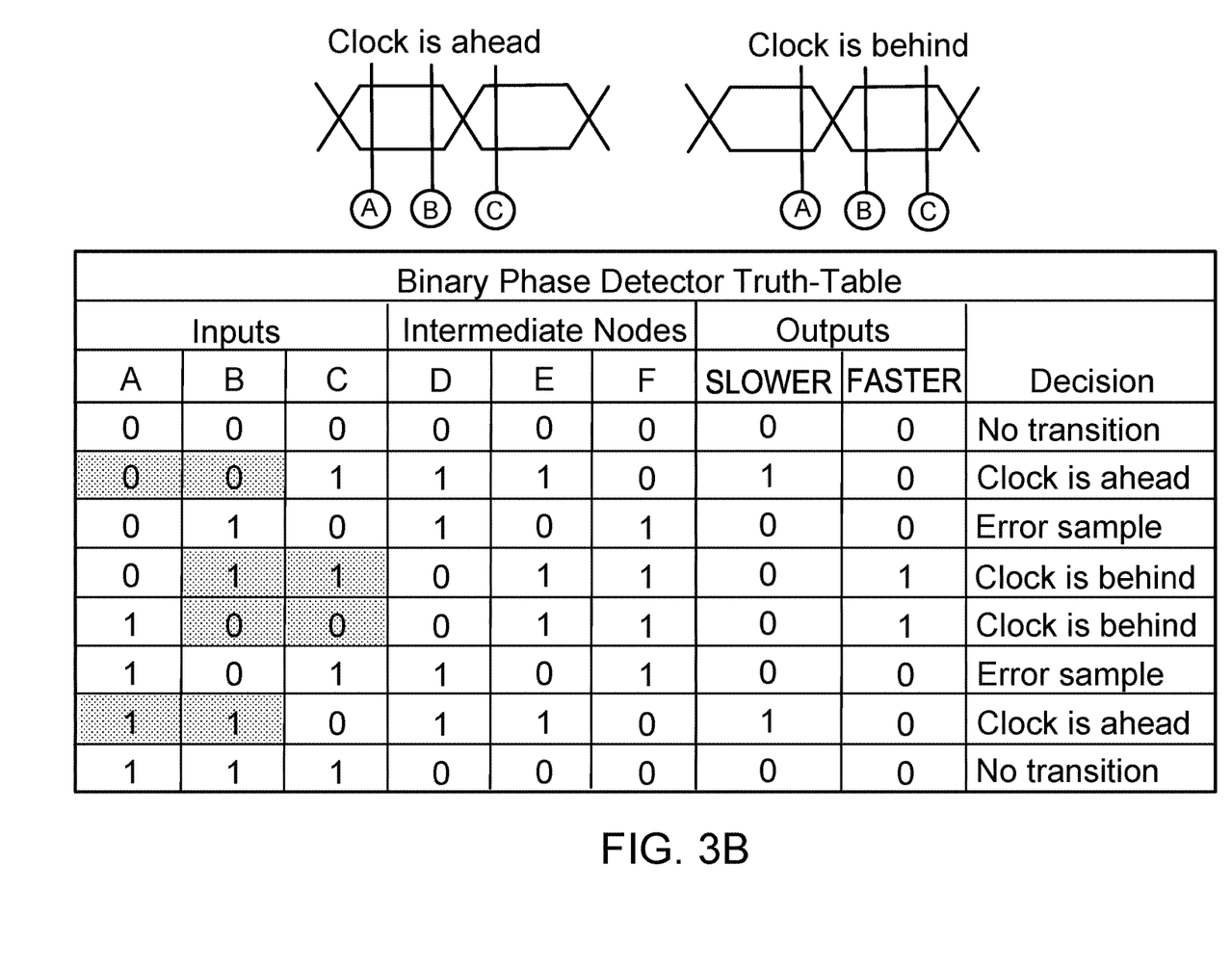
FIG. 3B illustrates an example of a sequential pattern and the truth table used in the operation of the binary phase detector of FIG. 2.

FIG. 3B shows the truth table for the example of the binary phase detector 202 with regard to intermediary signals A, to F from outputs of various D-flip flops or samplers or logic gates of FIG. 3A. The top panel illustrates the scenarios of when the clock signal is ahead of the input data stream and when the clock signal is behind the input data stream. In the first scenario, A and B are of same value while C is opposite of A and B. According to the truth table, this corresponds to when ABC encodes 110 or 001. Both entries in the truth table indicate that the clock is ahead of the input data stream. In this scenario, the second polarity signal will be produced—indicating that the clock needs to go slower. In the second scenario, A is of a value while B and C are opposite to this value. This represents an encoded 100 or 011. According to the truth table, the clock is behind the input data stream. In this scenario, a first polarity signal will be generated accordingly—indicating that the clock needs to go faster. In cases when ABC are not the previously mentioned four values of 110, 001, 100 or 011, neither of the first nor the second polarity signals will be generated. This could correspond to cases where ABC are 000 or 111 which indicate there has been no transition of input data stream, or where ABC are 010 or 101 where the input data stream is sampled in error.

Figure 3C:
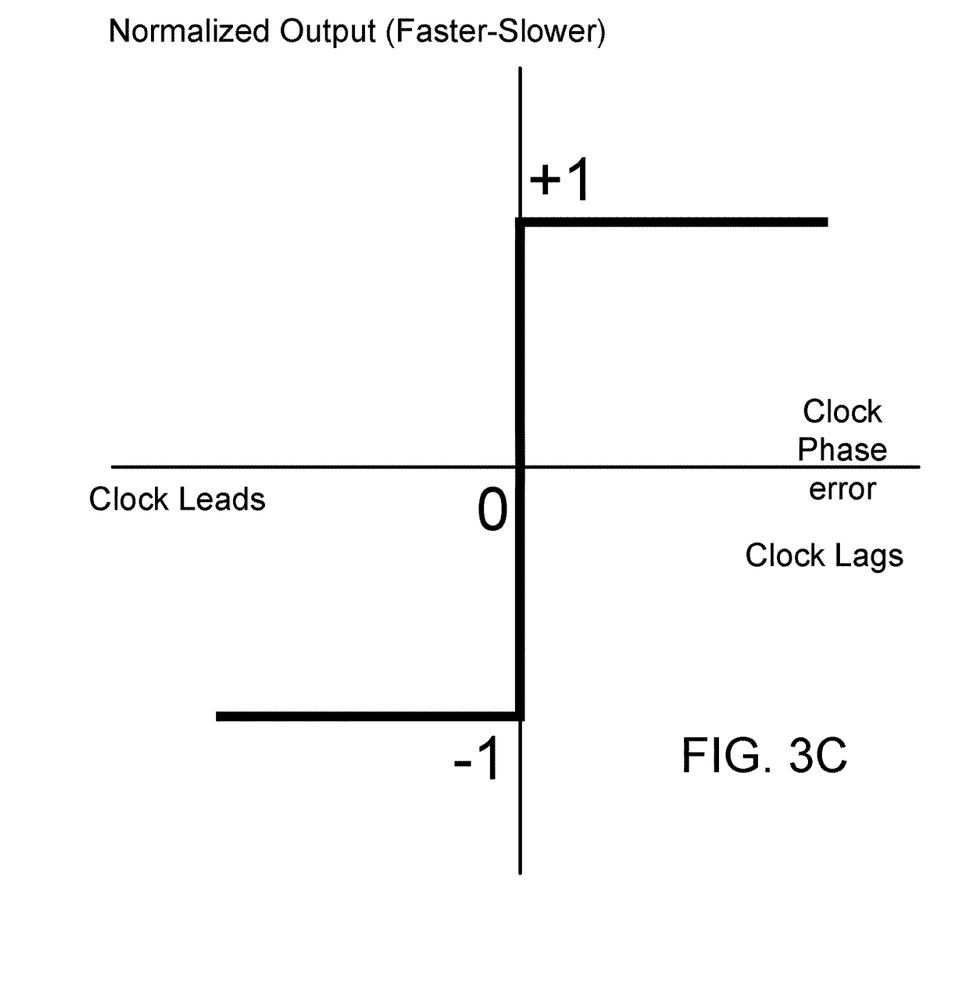
FIG. 3C illustrates an example of the transfer function characteristic of the binary phase detector of FIG. 2.

FIG. 3C illustrates the transfer function for the example of the binary phase detector 202. Particularly, FIG. 3C shows a transfer function that only supports operations at two polarities—when the data (e.g., the incoming data stream 112) leads or when the clock (e.g., synthesized clock output 114) leads. In other words, the phase detection only shows the polarity of the phase difference without revealing the amount of the phase difference. Indeed, the amount of phase difference need not be detected at the binary phase detector 202. The first polarity signal is generated on the output line 212 of FIG. 2 when the clock signal lags behind the input data stream and the second polarity signal is generated on the output line 222 of FIG. 2 when the clock signal leads the input data stream. In this illustration, the first polarity signal indicates that the clock signal needs to go faster while the second polarity signal indicates that the clock signal needs to go slower.

Returning to FIG. 2, the first polarity signal and the second polarity signal can feed into the digital filter 204 through the output lines 212 and 222, respectively. The digital filter can operate on the first polarity signal and the second polarity signal to generate output signals suitable for feeding into charge pump (CP) 206 and VCO 208. For example, the digital filtering can increase or decrease the pulse width the first polarity signal on 212 and the second polarity signal on 222 based on filtering algorithms implemented by the digital filter. In this illustration, the digital filter 204 produces outputs on the output lines 214 and 227 which are related to the first polarity signal 212 as well as on the output lines 224 and 229 which are related to the second polarity signal 222. The output line 214—known as the FasterI path—carries the polarity signal—indicating that the clock signal needs to go faster—directly into the charge pump 206. Likewise, the output line 227 carries the first polarity signal directly into the VCO 208 on this FasterP path. In some instances, identical filtered first polarity signals are distributed on the output lines 214 and 227. In these instances, an even splitter can be used inside the digital filter 204 such that signals on the output lines 214 and 227 are mirrored. In other instances, the output lines 214 and 227 can carry different filtered first polarity signals, each with, for example, varied pulse width. Similarly, the filtered second polarity signal is distributed on the output lines 224 and 229. The output line 224 carries the filtered second polarity signal directly to the charge pump 206 on the SlowerI path while the output line 229 carriers the filtered second signal on the SlowerP path directly into the VCO 208. The filtered second polarity signal, as carried on the outputs 224 and 229, can be the same in some instances. In other instances, filtered second polarity signal on the outputs 224 and 229 need not be identical.

The charge pump 206 is a charge pump circuit which varies an amount of charge stored on the capacitor 210 in response to signals received along the lines 214 and 224. The charge pump 206 provides output along an output line 216. One plate of the capacitor 210 is connected to the line 216 by a spur line 218; the other plate of the capacitor 210 can be connected to ground. The charge pump 114 operates to increase the amount of charge held by the capacitor 210 if a filtered first polarity signal is received on the line 214 and operates to decrease the amount of charge on the capacitor 210 if a filtered second polarity signal is received on the line 224. The amount by which the charge is varied can depend upon the length of the filtered first polarity and second polarity signals, and on the magnitude of current of the charge pump. The PLL circuit 106 need not include a damping resistor, i.e., there is no discrete resistor between the capacitor 210 and the line 216.

Together, the charge pump 206 and the capacitor 210 operate to integrate over time the outputs from the output lines 214 and 224. The integration can also generate a voltage representative of that integration process. The combination of a charge pump and a capacitor represents an example, other circuits can be employed to provide integration. In general, any of a wide variety of devices which can sum the output signals of the binary phase detector 202 and generate a voltage in response thereto can be employed. Specific example of an alternative integration means can include a digital integrator which employs a counter mechanism, the magnitude of this counter value—as provided to the input of VCO 208—may set the control voltage for the VCO 208 to generate an output with varied frequencies.

The VCO 208 receives filtered output signals from the output lines 227 and 229, as well as a signal along output line 216. In some instances, the output line 227 provide a direct connection to the output line 214 such that the output lines 227 and 214 carry identical first polarity signals. In other instances, the output lines 227 and 214 carry two different first polarity signal, both indicating the clock signal needs to go faster-albeit with different pulse widths, Similarly, the output line 229 can provide a direct connection to the output line 224, which can lead to identical second polarity signals on both output lines 229 and 224. Output lines 229 and 224 can also carry second polarity signals with different pulse widths. In sum, the output lines 227 and 229 represent polarity control path in addition to the output from the charge pump 206 in an integral control path. In this example, the VCO 208 generates a clock output signal which is responsive to both the voltage received along the output line 216 and both first polarity or second polarity signals received along the lines 227 or 229, respectively. In generating the clock output signal, the VCO is controlled by both the polarity control path—taken by the lines 227 and 229—as well as an integral control path—taken by the lines 214 and 224. This clock output signal represents the synthesized clock output signal 114. It has a frequency that is controlled by the filtered first polarity signal and second polarity signal as well as an integrated voltage signal on line 216. This clock output signal can be used for controlling operations of a microcontroller chip, for example, to sample and deserialize the bit stream of the incoming data stream 112 of FIG. 1. In this example, an instance of the synthesized clock output signal 114 is used as the feedback signal to serve as the master clock signal in FIG. 1.

Figure 4:
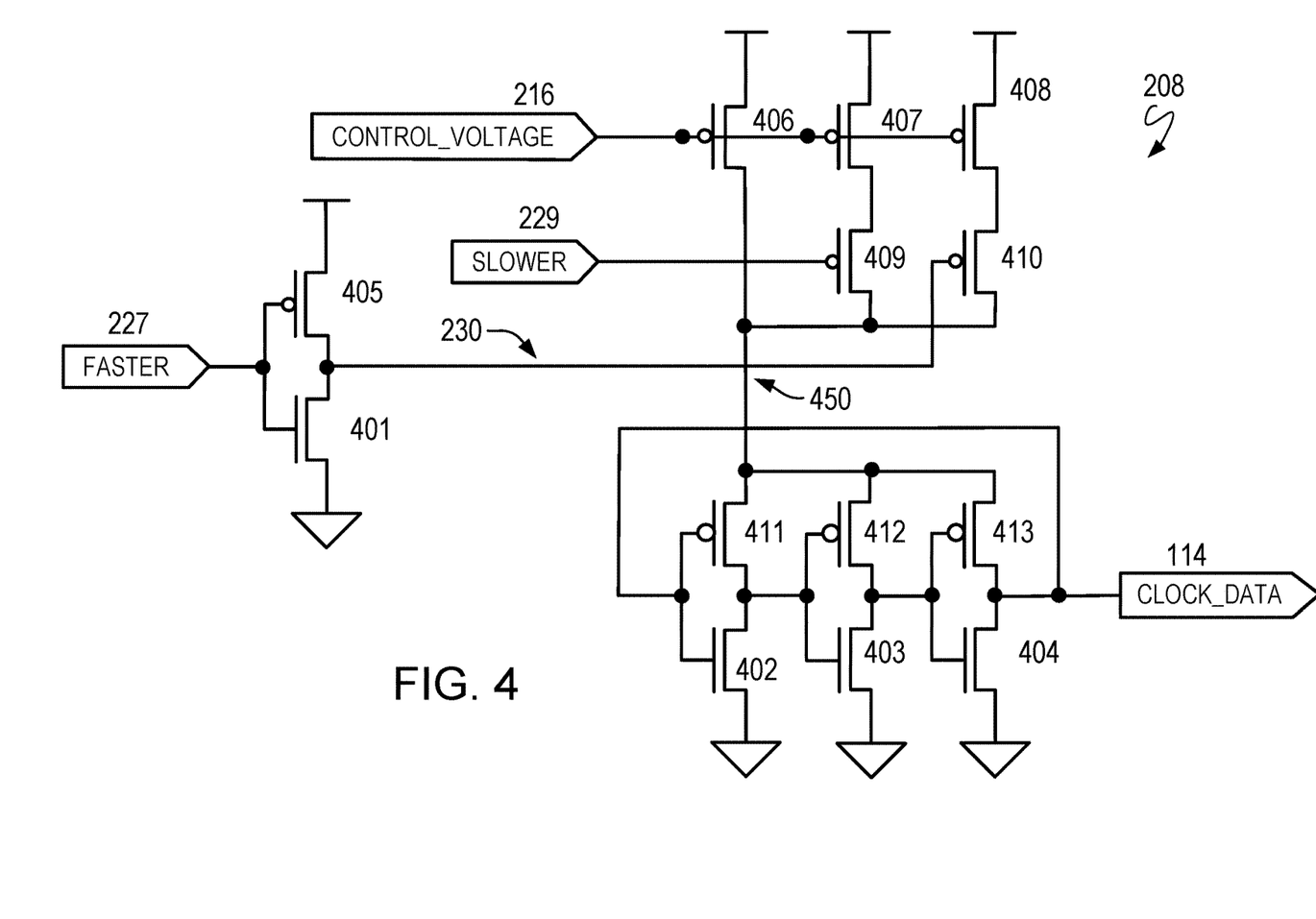
FIG. 4 shows an example of the Voltage Controlled Oscillator (VCO) of FIG. 2 with the polarity signals out of the digital filter being directly injected into the VCO.

FIG. 4 illustrates an example of the internal architecture of the voltage controlled oscillator (VCO) 208. This illustrative example of the VCO 208 includes four N-MOS transistors and nine P-MOS transistors. The four N-MOS transistors are identified in FIG. 3 by reference numerals 401, 402, 403, and 404. The nine transistors are identified by reference numerals 405, 406, 407, 408, 409, 401, 411, 412, and 413.

The six transistors in this illustrative example of VCO 208, 402-404 and 411-413 form a current controlled oscillator, whose frequency of oscillation is proportional to the current on the line 450.

The PMOS transistors 406-408 form a voltage to current converter circuit. The gates of transistors 406-408 are connected to the control voltage 216. These PMOS transistors produce a current at their drains which is proportional to the control voltage.

The transistors 409-410 act as switches. Switch transistor 409 is connected in series with current source transistor 407, and similarly transistor 410 is connected in series with transistor 408. The gate of switch transistor 410 is connected to an inverter that includes transistors 405 and 401 via signal line 230. The gate of this inverter is coupled to receive the first polarity signal from the output line 227. The gate of switch transistor 409 is coupled to directly receive the second polarity signal from the output line 229 and without going through an inverter.

The drain nodes of the voltage to current converter transistors are all connected to each other on line 450. The drains of transistors 407-408 are connected to line 450 through transistors 409-410, and drain of transistor 406 connected to line 450 directly.

In the case where no polarity control signal has been generated, signal from the output line 229 will be 0—thereby turning on switch 409 while signal 230 will be 1—thereby turning off switch 410. The net current in line 450 will be the summation of currents from transistors 406 and 407.

Upon the generation of the first polarity signal from the output line 227, which means signal from the output line 227 goes from value 0 to 1, the inverted signal on line 230 goes from value 1 to 0. This signal on the line 230 is coupled to gate of switch 410—thereby turning on the switch 410. Current in signal on the line 450 increases by the amount of current generated by the transistor 408. Thus for the duration of time the first control signal is generated, the current in signal on line 450 equals the summation of currents from transistors 406, 407 and 408. This represents an incremental increase in current in the line 450 by the current produced by the transistor 408. This incremental increase in current in the line 450, which when fed to the current controlled oscillator, increases its frequency for the duration of time the first polarity signal (from the output line 227) is generated, thereby advancing the phase of the synthesized clock output 114.

Upon the generation of second polarity signal from the output line 229, the gate of the switch transistor 409 goes from value 0 to 1—thereby switching off the transistor 409. The gate of the switch transistor 410 is also at 1 because signal from output line 230 is at 1. Current in signal in line 450 decreases by the amount of current generated by the transistor 407. Thus for the duration of time the second control signal is generated, the current in the signal from the line 450 equals just the current from the transistor 406. This represents an incremental decrease in current in the line 450 by the current produced by the transistor 407. This incremental decrease in current in line 450, which when fed to current controlled oscillator, decreases its frequency for the duration of time the second polarity signal (from the output line 229) is generated, thereby delaying the phase of the synthesized clock output 114.

Figure 5:
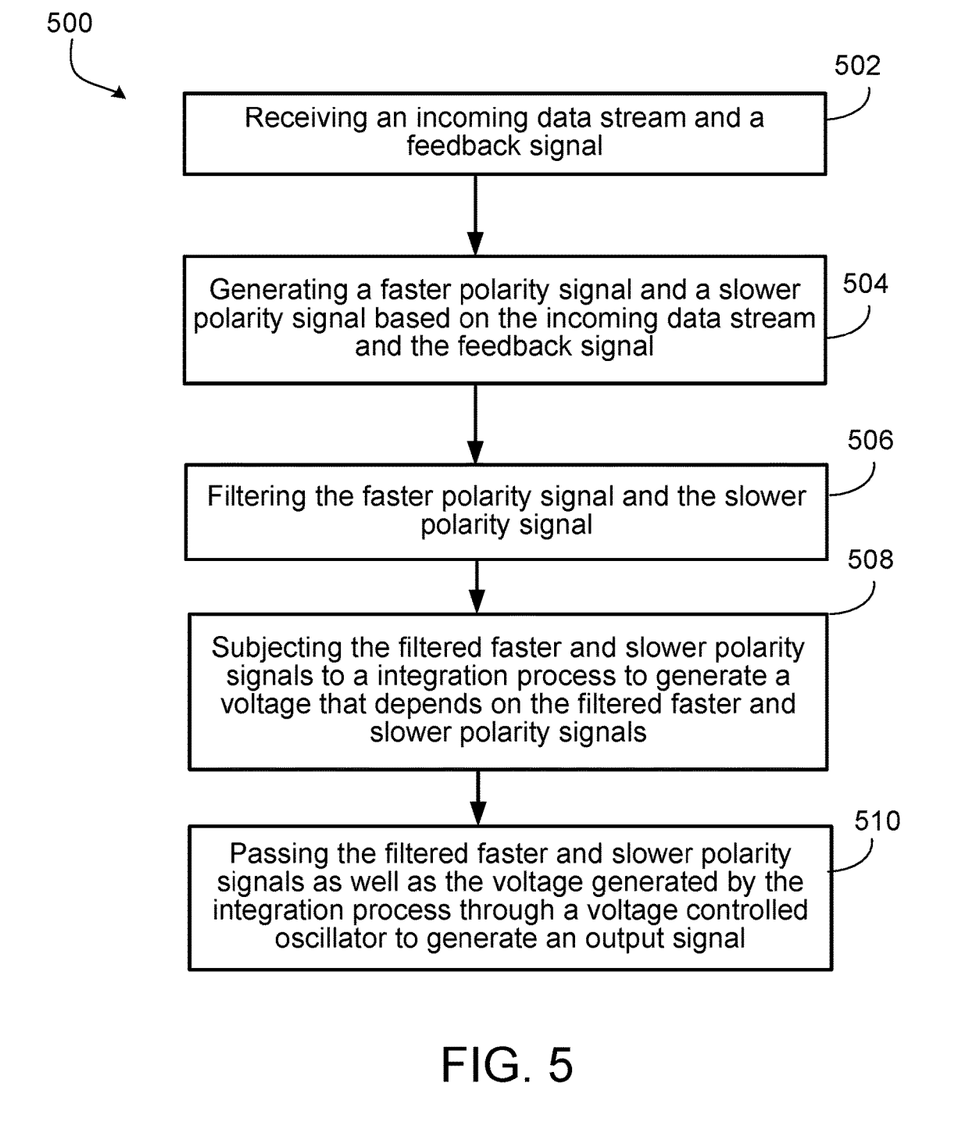
FIG. 5 is a flow chart showing an example of a method of synthesizing a digital clock from an input data stream.

Referring to FIG. 5, a method of synthesizing a digital clock from a bit stream of incoming digital data will now be described through an example of flow chart 500. The method of FIG. 5 can be employed in connection with a circuit as configured in FIGS. 2-4. However, the method can be employed in other circumstances and in connection with other circuitry, as well. Initially, an incoming data stream and a feedback signal are received (502). The incoming data stream can include a bit steam of binary bits, e.g., as seen on USB cables.

The incoming data stream and the feedback signal are transmitted through a binary phase detector which generates a pair of polarity signals (504). The two polarity signals respectively indicate whether the incoming data stream is leading the feedback signal, and whether the feedback signal is leading the incoming data stream. The difference between the first polarity signal and the second polarity signal does not represent a magnitude of phase difference between the incoming data stream and the feedback signal. For example, if the incoming data stream is leading the feedback signal, the first polarity signal can be high (while the second polarity signal is low). When the feedback signal is leading the incoming data stream, the second polarity signal can be high (while the first polarity signal is low). If the binary phase detector does not detect a difference, then both the first polarity signal and the second polarity signal can be low.

Neither the amplitude of the first polarity signal nor the amplitude of the second polarity signal relate to the amount of phase difference between the input data stream and the feedback signal. Likewise, the pulse duration of the first polarity signal or the second polarity signal does not represent the amount of phase difference between the input data stream and the feedback signal. Lastly, the difference between the first polarity signal and the second polarity signal does not represent a magnitude of phase difference between the incoming data stream and the feedback signal.

The first polarity signal and the second polarity signal are then processed by a digital filter (506). In some examples, the digital filtering can increase or decrease the pulse widths of the polarity signals. The digital filter may keep the pulse width of the polarity signals, increase the pulse width or decrease the pulse width subject to the filtering algorithms implemented by the digital filter.

The filtered first polarity signal and the filtered second polarity signal are then subject to an integration process to generate a voltage that depends on the filtered first polarity signal and the filtered slow polarity signal (508). In some examples, the filtered first and second polarity signals are passed through a charge pump which controls an amount of charge carried on a capacitor that depend on the filtered first and second polarity signals. The charge pump can vary the amount of charge stored on the capacitor in response to signals received. The amount by which the charge is varied can depend upon the length of the filtered first polarity signal and the filtered second polarity signal. In these examples, the capacitor can be coupled to the charge pump to store the charge while a resistor need not be coupled to the charge pump.

The filtered first polarity signal, the filtered second polarity signal, as well as the voltage generated by the integration process can then pass through a voltage controlled oscillator to generate an output signal (510). The output signal can be a synthesized clock signal. In some examples, the output signal is looped back as the feedback signal. The output signal has a frequency that is controlled by the summation signal as well as the first and second polarity signals.

What has been described is a digital feed forward current injection PLL method and apparatus which can be employed on or in conjunction with a microcontroller or processor chip for, for example, deserializing incoming bit stream on a USB device. Although the example of PLL circuit is advantageously employed as an on-chip component of any chip requiring a PLL, the advantages of the application are best exploited within microprocessor chips having very high operational frequencies. Indeed, a number of implementations have been described. Nevertheless, it will be understood that various modifications can be made without departing from the spirit and scope of the subject innovation. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A phase lock loop (PLL) circuit for synthesizing a clock signal from an incoming data stream, the PLL circuit comprising:
   a binary phase detector configured to
      receive the incoming data stream comprising binary bits, and a feedback signal, and
      based on the incoming data stream and the feedback signal, drive a comparator circuitry to generate digital inputs that jointly determine a first polarity signal and a second polarity signal, the first and second polarity signals respectively indicating whether the incoming data stream is leading the feedback signal, or whether the feedback signal is leading the incoming data stream;
   a digital filter coupled to the binary phase detector and configured to
      receive the first polarity signal and the second polarity signal, and
      filter the first polarity signal such that the filtered first polarity signal is generated on a first path and a second path, the first and second paths being different; and
      filter the second polarity signal such that the filtered second polarity signal is generated on a third path and a fourth path, the third and fourth paths being different;
   a charge pump coupled to the digital filter and configured to:
      receive the filtered first polarity signal on the second path,
      receive the filtered second polarity signal on the third path; and
      integrate the filtered first polarity signal and the filtered second polarity signal such that an integral signal is generated; and
   an oscillator coupled to the charge pump and the digital filter, the oscillator configured to
      receive the integral signal from the charge pump,
      receive, from the digital filter, the filtered first polarity signal on the first path;
      receive, from the digital filter, the filtered second polarity signal on the fourth path, and
      generate the synthesized clock signal, wherein the oscillator is configured such that a frequency of the synthesized clock signal is controlled by the integral signal as well as the filtered first and second polarity signals received, and wherein the synthesized clock signal is looped back to the binary phase detector as the feedback signal.

2. The PLL circuit of claim 1, wherein the comparator circuitry comprises a plurality of flip-flops, and wherein the comparator circuitry are configured to generate the digital inputs, the combination of which drives a decision on whether to adjust the feedback signal.

3. The PLL circuit of claim 2, wherein the flip-flops are clocked by the feedback signal, are wherein the flip-flops are edge-triggered by either a rising edge or a falling edge of the feedback signal.

4. The PLL circuit of claim 1, comprising a feed forward circuit connecting the charge pump to the oscillator, wherein the feed forward circuit comprises a capacitor connected between a line carrying the integral signal and ground.

5. The PLL circuit of claim 4, wherein the feed forward circuit does not include a loop stabilizing resistor.

6. The PLL circuit of claim 4, wherein the charge pump is configured to vary an amount of charge stored at the capacitor based on a magnitude of the integral signal and in response to the first or the second polarity signals being detected from the binary phase detector such that the amount of charge stored is incremented or decremented in accordance with the first or second polarity signals being detected.

7. The PLL of claim 1, wherein the filtered first polarity signal on the first path and the filtered first polarity signal on the second path are substantially identical.

8. The PLL of claim 1, wherein the filtered second polarity signal on the third path and the filtered second polarity signal on the fourth path are substantially identical.

9. The PLL of claim 1, wherein the incoming data stream is sampled by using the synthesized clock signal.

10. The PLL circuit of claim 1, wherein the first polarity signal provides a binary indication of whether or not the incoming data stream is leading the feedback signal, and the second polarity signals provides a binary indication whether or not the feedback signal is leading the incoming data stream.

11. The PLL of claim 1, wherein the filtered first polarity signal on the first path and the filtered first polarity signal on the second path are different, and wherein the filtered second polarity signal on the third path and the filtered second polarity signal on the fourth path are different.

12. The PLL of claim 1, wherein the filtered first polarity signal on the first path and the filtered first polarity signal on the second path are duplicates, and wherein the filtered second polarity signal on the third path and the filtered second polarity signal on the fourth path are duplicates.

13. The PLL of claim 1, wherein the filtered first polarity signal on the first path and the filtered first polarity signal on the second path are configured to drive the oscillator to run faster, while the filtered second polarity signal on the third path and the filtered second polarity signal on the fourth path are configured to drive the oscillator to run slower.

14. A method for synthesizing a clock signal from an incoming data stream, the method comprising:
   receiving the incoming data stream comprising binary bits, and a feedback signal;
   based on the incoming data stream and the feedback signal, generating digital inputs that jointly determine a first polarity signal and a second polarity signal, the first and second polarity signals respectively indicating whether the incoming data stream is leading the feedback signal, or whether the feedback signal is leading the incoming data stream;

digitally filtering the first polarity signal and the second polarity signal by:
   digitally filtering the first polarity signal such that the filtered first polarity signal is generated on a first path and a second path, the first and second paths being different; and
   digitally filtering the second polarity signal such that the filtered second polarity signal is generated on a third path and a fourth path, the third and fourth paths being different;
generating an integral signal by integrating the filtered first polarity signal and the filtered second polarity signal, wherein integrating the filtered first polarity signal and the filtered second polarity signal to generate the integral signal comprises: integrating the first polarity signal from the second path and integrating the second polarity signal from the third path; and
generating the synthesized clock signal based on the integral signal, the filtered first polarity signal, and the filtered second polarity signal, wherein the synthesized clock signal has a frequency that is controlled by the integral signal as well as the filtered first and second polarity signals, and wherein the synthesized clock signal serves as the feedback signal.

15. The method of claim 14, wherein generating the digital inputs comprises using a plurality of flip-flops and logic gates to generate the digital inputs that jointly determine a transition either from a first state that the incoming data stream is leading the feedback signal to a second state that the feedback signal is leading the incoming data stream or from the second state to the first state.

16. The method of claim 15, further comprising: clocking the flip flops by the feedback signal such that the flip-flops are triggered either at a rising edge or a falling edge of the feedback signal.

17. The method of claim 14, wherein integrating the filtered first and second polarity signals is performed by a charge pump coupled to a capacitor such that an amount of charge stored at the capacitor is varied based on a magnitude of the generated integral signal and in response to the first or the second polarity signals being detected from a binary phase detector, and wherein the amount of charge stored is incremented or decremented in accordance with the first or second polarity signals being detected.

18. The method of claim 14, further comprising:
   sampling the incoming data stream based on the synthesized clock signal; and
   deserializing the sampled incoming data stream according to the synthesized clock signal to generate a converted data stream suitable for subsequent processing by a digital processor.

19. The method of claim 14, wherein the first polarity signal provides a binary indication of whether or not the incoming data stream is leading the feedback signal, and the second polarity signals provides a binary indication whether or not the feedback signal is leading the incoming data stream,
   wherein the filtered first polarity signal on the first path and the filtered first polarity signal on the second path are duplicates, and
   wherein the filtered second polarity signal on the third path and the filtered second polarity signal on the fourth path are duplicates.

20. The method of claim 14, wherein the filtered first polarity signal on the first path and the filtered first polarity signal on the second path are configured to drive an oscillator to run faster, while the filtered second polarity signal on the third path and the filtered second polarity signal on the fourth path are configured to drive the oscillator to run slower.

* * * * *